United States Patent
Hirata et al.

(10) Patent No.: US 11,226,641 B2
(45) Date of Patent: Jan. 18, 2022

(54) FLUID CONTROL DEVICE

(71) Applicant: FUJIKIN INCORPORATED, Osaka (JP)

(72) Inventors: Kaoru Hirata, Osaka (JP); Katsuyuki Sugita, Osaka (JP); Takahiro Imai, Osaka (JP); Shinya Ogawa, Osaka (JP); Kouji Nishino, Osaka (JP); Nobukazu Ikeda, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 18 days.

(21) Appl. No.: 16/340,155

(22) PCT Filed: Oct. 12, 2017

(86) PCT No.: PCT/JP2017/036949
§ 371 (c)(1),
(2) Date: Apr. 8, 2019

(87) PCT Pub. No.: WO2018/070464
PCT Pub. Date: Apr. 19, 2018

(65) Prior Publication Data
US 2019/0243391 A1    Aug. 8, 2019

(51) Int. Cl.
*G05D 7/06*    (2006.01)
*H01L 21/67*   (2006.01)

(52) U.S. Cl.
CPC ......... *G05D 7/0635* (2013.01); *G05D 7/0652* (2013.01); *H01L 21/67017* (2013.01)

(58) Field of Classification Search
CPC ....... G05D 7/06; G05D 7/0641; G05D 7/0652
USPC ........................ 137/599.01, 599.06, 599.07
See application file for complete search history.

(56) References Cited

U.S. PATENT DOCUMENTS

| | | | | |
|---|---|---|---|---|
| 3,893,469 A | * | 7/1975 | Baker | F16K 5/0626 137/584 |
| 9,733,649 B2 | | 8/2017 | Nagase et al. | |
| 2010/0269924 A1 | | 10/2010 | Yasuda | |
| 2011/0120566 A1 | | 5/2011 | Ohmi et al. | |
| 2011/0139271 A1 | * | 6/2011 | Hirata | G05D 7/0635 137/487.5 |
| 2014/0034164 A1 | * | 2/2014 | Yasuda | G05D 7/0652 137/599.01 |

(Continued)

FOREIGN PATENT DOCUMENTS

JP      3616875 B2     2/2005
JP    2011180992 A     9/2011
(Continued)

OTHER PUBLICATIONS

International Search Report issued in PCT/JP2017/036949; dated Dec. 26, 2017.

*Primary Examiner* — Paul J Gray
(74) *Attorney, Agent, or Firm* — Studebaker & Brackett PC

(57) ABSTRACT

A fluid control device includes a main body block including a first flow passage, and a second flow passage, a first and second fluid control units installed on an installation surface of the main body block. The first and second flow passages include a first portion extending along a first direction and a second flow passage portion orthogonal to the first direction. The second portion is formed of a hole extending from a side surface of the main body block and a sealing member.

11 Claims, 9 Drawing Sheets

(56) References Cited

U.S. PATENT DOCUMENTS

2015/0318192 A1  11/2015  Ito

FOREIGN PATENT DOCUMENTS

| JP | 5430007 | B2 | 2/2014 |
| JP | 2015146163 | A | 8/2015 |
| JP | 2015213122 | A | 11/2015 |
| JP | 5947659 | B2 | 7/2016 |
| KR | 101028213 | B1 | 4/2011 |
| KR | 20140116155 | A | 10/2014 |

\* cited by examiner (a)

(b)

(c)

(a)

(b)

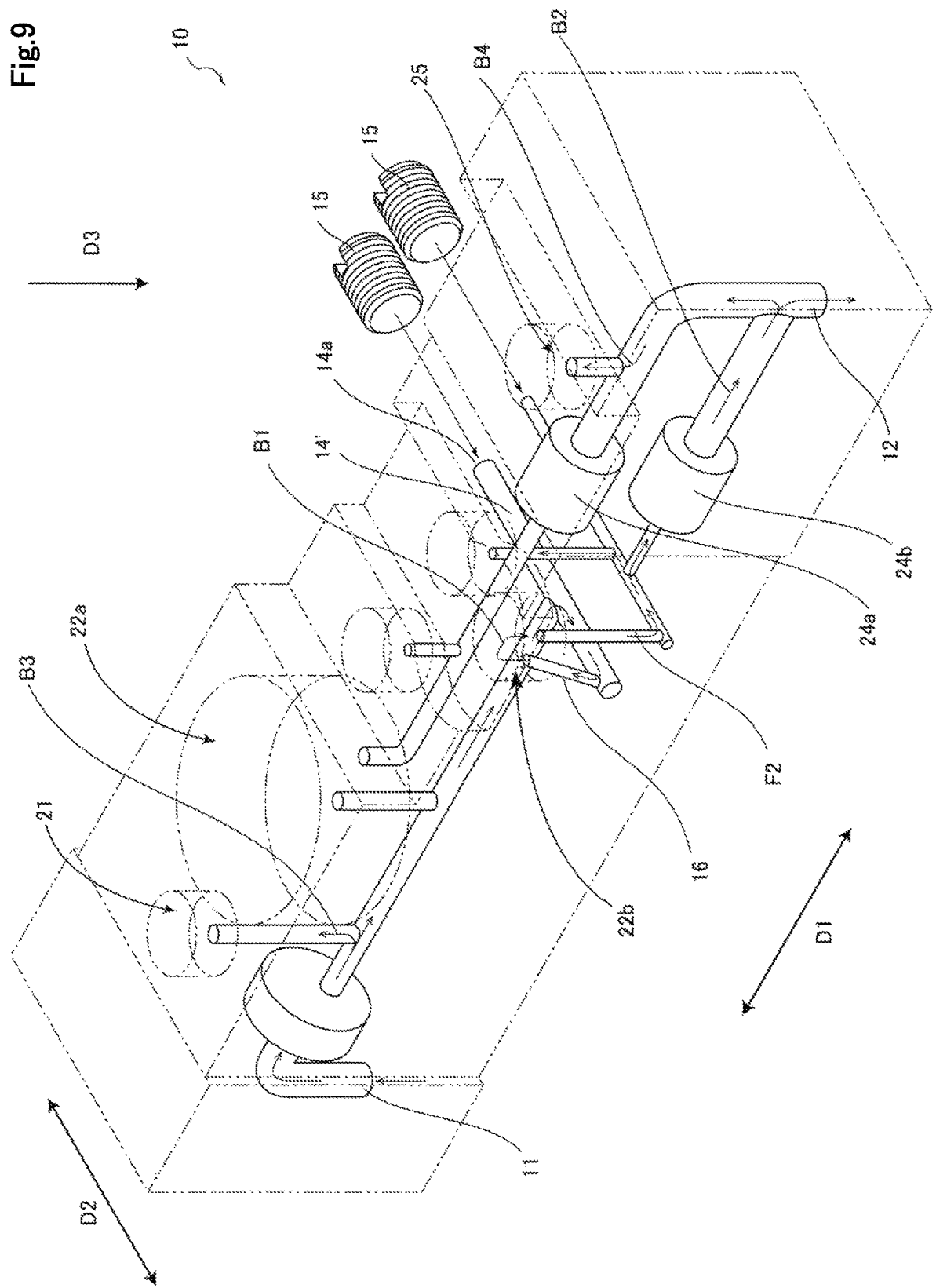

FLUID CONTROL DEVICE

TECHNICAL FIELD

The present invention relates to a fluid control device, and particularly relates to a fluid control device provided with a plurality of flow passages.

BACKGROUND ART

In semiconductor manufacturing devices and chemical plants, various types of flowmeters and flow controllers have been used in order to control fluids, such as a raw material gas and an etching gas. Among them, a pressure-type flow controller is capable of precise flow control for various fluids with a relatively simple mechanism formed of a combination of a piezo-driven control valve and a restriction part (orifice plate, critical nozzle), for example, and thus has been widely used.

In some pressure-type flow controllers, the flow rate is controlled using the principle that when a critical expansion condition P1/P2 about 2 (P1: gas pressure on the upstream side of the restriction part (upstream pressure), P2: gas pressure on the downstream side of the restriction part (downstream pressure)) is satisfied, the flow rate is determined not by the downstream pressure P2 but by the upstream pressure P1. In a pressure-type flow controller of this type, simply by controlling the upstream pressure P1 using a pressure sensor and a control valve, the flow rate of the gas flowing on the downstream side of the restriction part can be precisely controlled.

CITATION LIST

Patent Literature

Patent Document 1: Japanese Patent No. 5430007
Patent Document 2: Japanese Patent No. 5947659
Patent Document 3: Japanese Patent No. 3616875

SUMMARY OF INVENTION

Technical Problem

In order to achieve precise flow rate control in a wide flow rate range, a pressure-type flow controller including a restriction part for high flows and a restriction part for low flows is known. For example, Patent Document 1 describes a configuration in which a switching valve is used to control the opening and closing of a flow passage provided with an orifice (restriction part) for high flows, thereby performing high-flow supply and low-flow supply through different flow passages.

In the pressure-type flow controller described in Patent Document 1, the upstream pressure and the flow rate are controlled using a control valve provided in common on the upstream side of the orifices for high flows and for low flows. However, in the above pressure-type flow controller, a single control valve is used, and the flow passages between the control valve and the respective orifices communicate with each other. Accordingly, it has been sometimes difficult to instantly control the upstream pressure to the desired pressure immediately after switching between a low-flow range and a high-flow range. This may cause unnecessary flow rate changes, such as overshoot or undershoot.

Meanwhile, Patent Document 2 describes a configuration in which in a main body block having formed therein a single inflow port, two flow rate control units each including a control valve are separately provided along two flow passages. In this configuration, two flow passages are independently provided, and also the control valve provided in each flow passage can be independently controlled. Therefore, pressure control in each flow passage can be performed more precisely.

However, according to the configuration described in Patent Document 2, the flow passages from the inflow port to the respective flow rate control units are provided to extend obliquely in plan view. As a result, there may be a problem in that alignment for drilling to form the flow passages is not easy. In addition, according to the configuration described in Patent Document 2, an oblique flow passage extending from the inflow port and expanding in the width direction is provided, leading to another problem in that it is difficult to design a main body block with reduced width and length.

The present invention has been accomplished in view of the above problems, and an object thereof is to provide a fluid control device having a plurality of flow passages, configured such that fluid control at the time of flow passage switching can be appropriately performed, and also a compact size design is possible.

Solution to Problem

A fluid control device according to an embodiment of the present invention includes a main body block including a common inflow port, a common outflow port, a first flow passage, and a second flow passage, the first flow passage and the second flow passage both communicating with the common inflow port and the common outflow port; a first fluid control unit provided in the first flow passage; and a second fluid control unit provided in the second flow passage. At least part of the first fluid control unit and at least part of the second fluid control unit are fixed to an installation surface of the main body block. At least one of the first flow passage and the second flow passage includes a first flow passage portion extending along a first direction as viewed from a normal direction of the installation surface and a second flow passage portion extending along a second direction orthogonal to the first direction as viewed from the normal direction. The second flow passage portion includes a hole extending along the second direction from a surface located lateral to the installation surface of the main body block and a sealing member closing an aperture of the hole.

In one embodiment, the first fluid control unit and the second fluid control unit each include a control valve, an upstream pressure sensor provided on a downstream side of the control valve, a restriction part provided on a downstream side of the upstream pressure sensor, and a control part connected to the upstream pressure sensor and the control valve to form a pressure-type flow rate control unit.

In one embodiment, the control valve of the first fluid control unit and the control valve of the second fluid control unit are spaced apart from each other in the first direction.

In one embodiment, the first flow passage and the second flow passage at least partially overlap each other as viewed from the normal direction.

In one embodiment, the control part is configured such that when a fluid is flowed through one flow passage of the first flow passage and the second flow passage, based on the output of the upstream pressure sensor provided in said one flow passage, the opening degree of the control valve is controlled, while the control valve provided in the other flow passage is controlled to close.

In one embodiment, the control part is configured such that when a fluid is flowed through said one flow passage, the flow rate in the other flow passage after closing the control valve provided in the other flow passage is detected, and, based on the detection results, the control valve provided in said one flow passage is controlled.

In one embodiment, the fluid control device further includes, on a downstream side of the restriction parts of the first fluid control unit and the second fluid control unit, a downstream pressure sensor provided in common for the first flow passage and the second flow passage.

In one embodiment, the main body block is formed by connecting and fixing a first block portion having formed therein part of the first flow passage and part of the second flow passage and a second block portion having formed therein part of the first flow passage and part of the second flow passage, and, at a connection between the first block portion and the second block portion, the restriction part of the first fluid control unit and the restriction part of the second fluid control unit are provided.

In one embodiment, the restriction parts each include an orifice member.

In one embodiment, the control valves each include a sheet made of a resin.

In one embodiment, the main body block has an approximately rectangular shape as viewed from the normal direction, and the first direction is a length direction of the main body block, while the second direction is a width direction of the main body block.

In one embodiment, the first flow passage and the second flow passage do not include a flow passage portion extending along an oblique direction different from the first direction and the second direction as viewed from the normal direction.

In one embodiment, in an entire flow passage including the first flow passage and the second flow passage, an angular U-shaped flow passage portion is included as viewed from the normal direction.

Advantageous Effects of Invention

According to embodiments of the present invention, in a fluid control device having a plurality of flow passages, fluid control at the time of changing the flow passage can be suitably performed, and also a compact design can be achieved.

BRIEF DESCRIPTION OF DRAWINGS

FIG. 9 A perspective view schematically showing the flow passages of the fluid control device shown in FIG. 5 to FIG. 7, where how a gas flows through the second flow passage is indicated with arrows.

DESCRIPTION OF EMBODIMENTS

Hereinafter, embodiments of the present invention will be described with reference to the drawings, but the present invention is not limited to the following embodiments.

Figure 1:
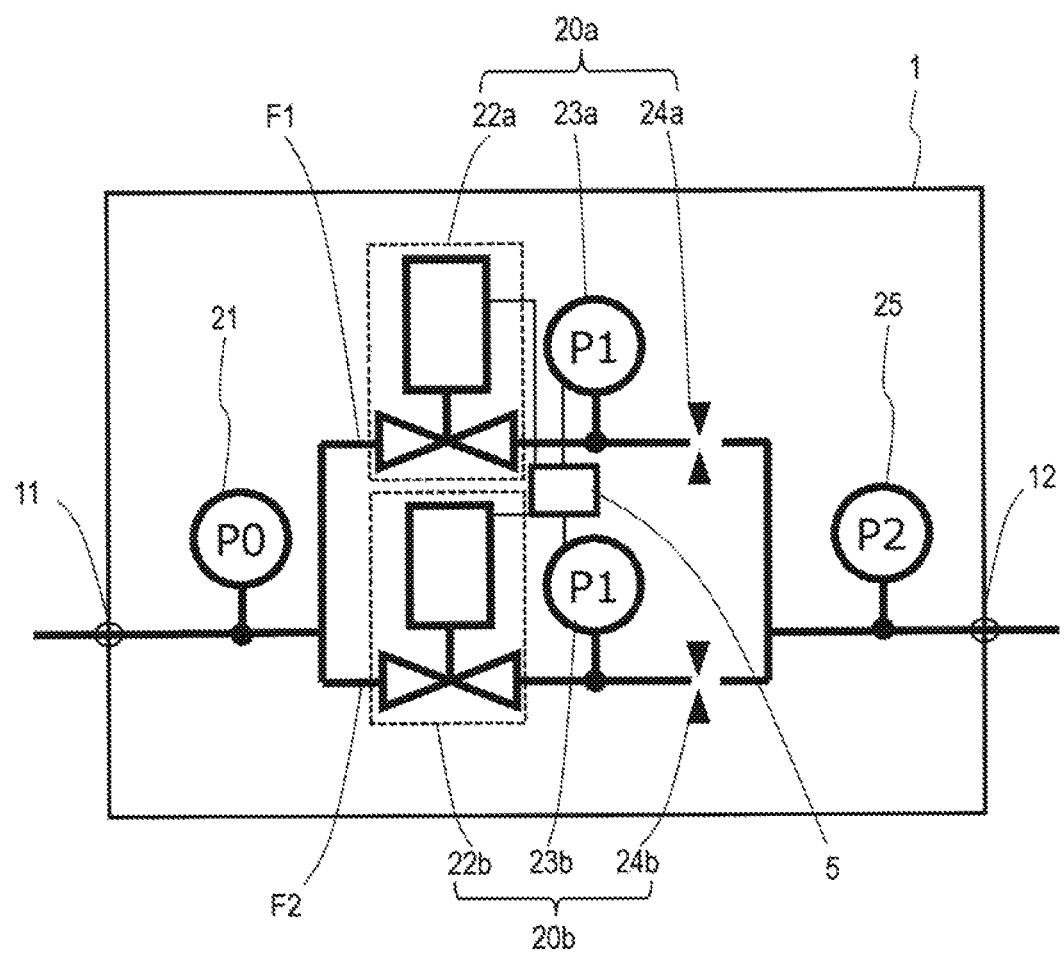
FIG. 1 A schematic diagram showing the configuration of a fluid control device (pressure-type flow controller) according to an embodiment of the present invention.

FIG. 1 is a schematic diagram showing the configuration of a pressure-type flow controller 1, which is a fluid control device according to an embodiment of the present invention. The pressure-type flow controller 1 has a common inflow port 11 and a common outflow port 12, and two flow passages, a first flow passage F1 and a second flow passage F2, are provided between them. The first flow passage F1 and the second flow passage F2 communicate with the common inflow port 11 and the common outflow port 12, and are formed to branch from the common inflow port 11 and join again to the common outflow port 12. The first flow passage F1 and the second flow passage F2 are portions provided separate from each other in flow passages between the common inflow port 11 and the common outflow port 12, corresponding to two separate flow passages from the flow passage branching point on the common inflow port 11-side to the flow passage joining point on the common outflow port 12-side.

The upstream side of the pressure-type flow controller 1 is connected to a gas supply source, and the downstream side is connected to a process chamber of a semiconductor manufacturing device. The process chamber has connected thereto a vacuum pump, and the inside of the process chamber can be evacuated. In addition, on the downstream side of the pressure-type flow controller 1, a downstream open/close valve (not shown) is provided, and the gas supply to the process chamber can be shut off using the downstream open/close valve. The downstream open/close valve may also be incorporated inside the pressure-type flow controller 1.

In the first and second flow passages F1 and F2, first and second pressure-type flow rate control units (fluid control units) 20a and 20b are provided, respectively. The first and second pressure-type flow rate control units 20a and 20b include, respectively, control valves 22a and 22b, upstream pressure sensors 23a and 23b provided on the downstream side of the control valves 22a and 22b, and restriction parts 24a and 24b provided on the downstream side of the upstream pressure sensors 23a and 23b. In addition, the first and second pressure-type flow rate control units 20a and 20b include a common control part 5 connected to the upstream pressure sensors 23a and 23b and the control valves 22a and 22b.

The pressure-type flow controller 1 further includes, as common components for the flow passages F1 and F2, an inflow pressure sensor 21 provided on the upstream side of the control valves 22a and 22b and a downstream pressure sensor 25 provided on the downstream side of the restriction parts 24a and 24b.

The upstream pressure sensor 23a/23b can measure the pressure of the flow passage between the control valve 22a/22b and the restriction part 24a/24b, and the downstream pressure sensor 25 can measure the pressure on the downstream side of the restriction parts 24a and 24b. In addition, the inflow pressure sensor 21 can measure the pressure of the gas supplied from a gas supply device (e.g., raw material vaporizer) connected to the common inflow port 11 and can be used to control the gas supply amount or supply pressure.

The control valves 22a and 22b may each be a piezo-driven control valve composed of a metal diaphragm valve as a valve mechanism and a piezo element as a driver that drives the valve (piezo actuator), for example. The upstream pressure sensors 23a and 23b, the downstream pressure sensor 25, and the inflow pressure sensor 21 may each incorporate a monocrystalline silicon sensor chip and a diaphragm, for example.

In addition, although not shown, the first and second pressure-type flow rate control units 20a and 20b may each have a temperature sensor for measuring the temperature of a gas flowing through the flow passage F1/F2. The temperature sensor may be separately provided for each of the flow passages F1 and F2 in the vicinity of the upstream pressure sensor 23a/23b, or may also be provided in common in the case where the flow passages F1 and F2 are disposed close to each other. As the temperature sensor, a thermistor can be used, for example. The output of the temperature sensor is used to compute the flow rate more precisely in the control part 5.

In the pressure-type flow controller 1, based on the output of the upstream pressure sensors 23a and 23b, the control part 5 controls the control valves 22a and 22b so that the flows passing through the restriction parts 24a and 24b will each be the set flow rate. The control part 5 includes a CPU, a memory (storage device) M such as ROM or RAM, an A/D converter, and the like mounted on a circuit board. The control part 5 may include a computer program configured to execute the operation described below and can be realized by a combination of a hardware and a software. The control part 5 may be provided in any mode as long as the operation of the first and second pressure-type flow rate control units 20a and 20b can be independently controlled, and may be provided in common for the first and second pressure-type flow rate control units 20a and 20b.

In this embodiment, the first flow passage F1 is a flow passage used when flowing a high-flow gas, and the second flow passage F2 is a flow passage used when flowing a low-flow gas. Specifically, the bore diameter of the restriction part 24a provided in the first flow passage F1 is formed larger than the bore diameter of the restriction part 24b provided in the second flow passage F2. In this configuration, when the control valve 22b provided in the second flow passage F2 is closed to shut off the second flow passage F2, and the flow rate is controlled using the first pressure-type flow rate control unit 20a, a gas of a desired flow rate can be supplied to the process chamber through the first flow passage F1. Similarly, when the control valve 22a provided in the first flow passage F1 is closed to shut off the first flow passage F1, and the flow rate is controlled using the second pressure-type flow rate control unit 20b, a gas of a desired flow rate can be supplied through the second flow passage F2.

Figure 2:
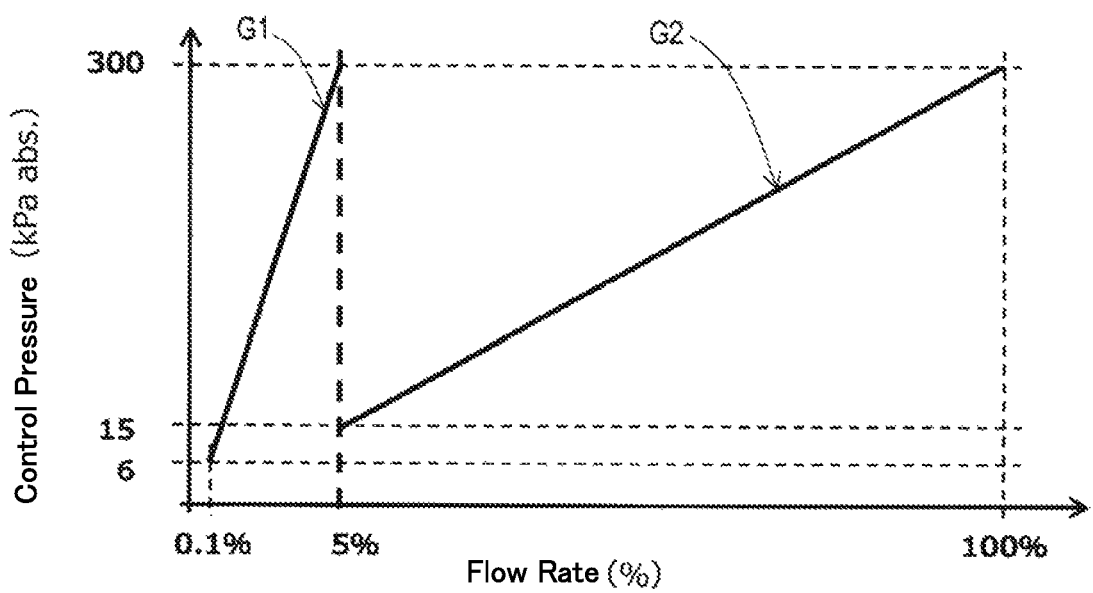
FIG. 2 A graph showing the relation between the flow rate and the control pressure when flowing a low flow using a second flow passage and the relation between the flow rate and the control pressure when flowing a high flow using a first flow passage.

FIG. 2 is a graph showing the relation between the flow rate (the ratio relative to the maximum flow as 100%) and the control pressure (upstream pressure corresponding to the flow rate). At a flow rate of 0.1% to 5% (e.g., a low flow of 1 to 50 sccm), as can be seen from the graph G1, in the second flow passage F2, the opening and closing degree of the control valve 22b is adjusted to control the upstream pressure, whereby the gas can be supplied precisely at a desired flow rate. Similarly, at a flow rate of 5% to 100% (e.g., a high flow of 50 to 1,000 sccm), as can be seen from the graph G2, in the first flow passage F1, the opening and closing degree of the control valve 22a is adjusted to control the upstream pressure, whereby the gas can be supplied precisely at a desired flow rate. Needless to say, the low-flow rate range and the high-flow rate range are not limited to the above examples, and may be set at various ranges.

In the pressure-type flow controller 1, for the first flow passage F1 and the second flow passage F2, the first pressure-type flow rate control unit 20a and the second pressure-type flow rate control unit 20b capable of independent operation are separately provided. Therefore, even at the time of flow passage switching, the control valves 22a and 22b can be separately controlled, allowing for pressure adjustment with high responsiveness. In addition, the space between the control valve 22a and the restriction part 24a in the first flow passage F1 and the space between the control valve 22b and the restriction part 24b in the second flow passage F2 are separate from each other. Therefore, at the time of flow passage switching, the upstream pressure of one flow passage does not directly affect the upstream pressure of the other flow passage. Accordingly, the occurrence of overshoot or undershoot at the time of flow passage switching can be suppressed, making it possible to appropriately supply a gas at any set flow rate.

The control part 5 is suitably configured such that when a fluid is flowed through one of the first flow passage F1 and the second flow passage F2, based on the output of the upstream pressure sensor or the like provided in the flow passage, the opening degree of the control valve is feedback-controlled to control the flow rate, while the control valve provided in the other flow passage is controlled to close so as to prevent the gas from simultaneously flowing through both flow passages. When a gas flows through only one of the flow passages like this, precise flow control is further facilitated.

In addition, the pressure-type flow controller 1 is preferably configured such that in order for a gas to flow through only one of the flow passages as described above, the control valve provided in the other flow passage can completely close the flow passage. For this purpose, it is suitable to use a sheet made of a resin (e.g., made of polychlorotrifluoroethylene (PETFE)) as a sheet of the control valve. When a resin sheet is used, airtightness when closing the control valve can be improved, whereby flow passage switching can be suitably performed.

Flow control can be performed by various methods same as before (e.g., the method described in Patent Document 1). For example, when a critical expansion condition (P1≧about 2×P2: in the case of argon gas) is satisfied, the control may be such that a computed flow rate is calculated from the output P1 of the upstream pressure sensor according to the relation Q (flow rate)=K1P1 (K1 is a proportionality coefficient depending on the kind of fluid and the fluid temperature), and the control valve is feedback-controlled so that the computed flow rate will be the same as the set flow rate. In addition, under a non-critical expansion condition, the control may be such that a computed flow rate is calculated from the output P1 of the upstream pressure sensor and the output P2 of the downstream pressure sensor according to the relation Qc (flow rate)=$K2P2^m(P1-P2)^n$ (K2 is a proportionality coefficient depending on the kind of fluid and the fluid temperature, and exponents m and n are values derived from the actual flow rate), and the control valve is feedback-controlled so that the computed flow rate will be the same as the set flow rate. The computed flow rate may be modified based on the output of the temperature sensor.

Hereinafter, with reference to FIGS. 3(a) to (c), a specific example of controlling the control valves at the time of switching from the flow Q1 (high-flow range) to the flow Q2 (low-flow range) will be described.

FIG. 3(a) shows the opening and closing timing of the control valves 22a and 22b provided in the first flow passage F1 and the second flow passage F2. In the example shown in FIG. 3(a), at the time instant ts, in synchronization with switching the control valve 22a of the first flow passage F1 from OPEN to CLOSE, the control valve 22b of the second flow passage F2 is switched from CLOSE to OPEN.

However, as shown in FIG. 3(b), in the case where the gas is flowing through the first flow passage F1 at the flow Q1, after the control valve 22a is closed at the time instant ts, the gas flow does not instantaneously decrease to 0, but decreases in a decaying fashion accompanied by a decrease in the upstream pressure. This is because even after the control valve 22a is closed, the gas between the control valve 22a and the restriction part 24a flows out through the restriction part 24a with the upstream pressure being higher than the downstream pressure.

Meanwhile, the gas flow in the second flow passage F2 does not instantaneously increase to the set flow rate Q2 either, but increases slowly with time. Incidentally, in order to prevent a rapid flow change, it is known to control the control valve according to a known ramp function. In this case, the desired value of flow rate itself increases with time.

Here, in this embodiment, after the control valve 22a provided in the first flow passage F1 is closed, the gas flow rate in the first flow passage F1 is detected using the upstream pressure sensor 23a, and, based on the detection results, the opening degree of the control valve 22b provided in the second flow passage F2 is controlled. More specifically, the gas flow through the second flow passage F2 is increased to match the degree of decrease in the gas flow through the first flow passage F1. As a result, as shown by the solid line in the graph of FIG. 3(c), the total flow rate $Q_{total}$ of the gas flow through the first flow passage F1 and the gas flow through the second flow passage F2 can be smoothly changed from the flow rate Q1 to the flow rate Q2. Therefore, at the time of flow rate switching, the occurrence of undershoot U or the occurrence of overshoot as shown by the dashed line in the graph can be prevented.

The gas flow rate through the second flow passage F2 can be appropriately controlled by, for example, calculating the time constant of decay from the detected gas flow rate in the first flow passage F1 and, based on the time constant, determining the control signal (e.g., ramp rate, etc.) of the control valve 22b of the second flow passage F2.

Figure 4:
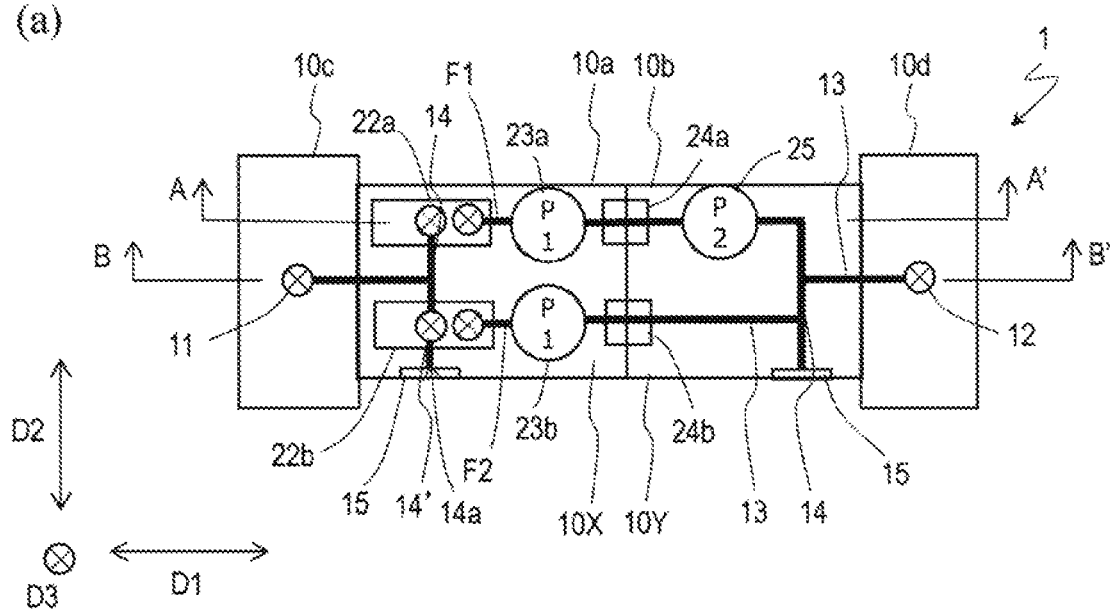
FIG. 4 Schematic diagrams illustrating a configuration example of a fluid control device according to an embodiment of the present invention; (a) is a plan view, and (b) is a cross-sectional view along the lines A-A' and B-B' in (a), which is a composite cross-sectional view showing a cross-section along the line A-A' at the center and a cross-section along the line B-B' line at each end.
Figure 4:
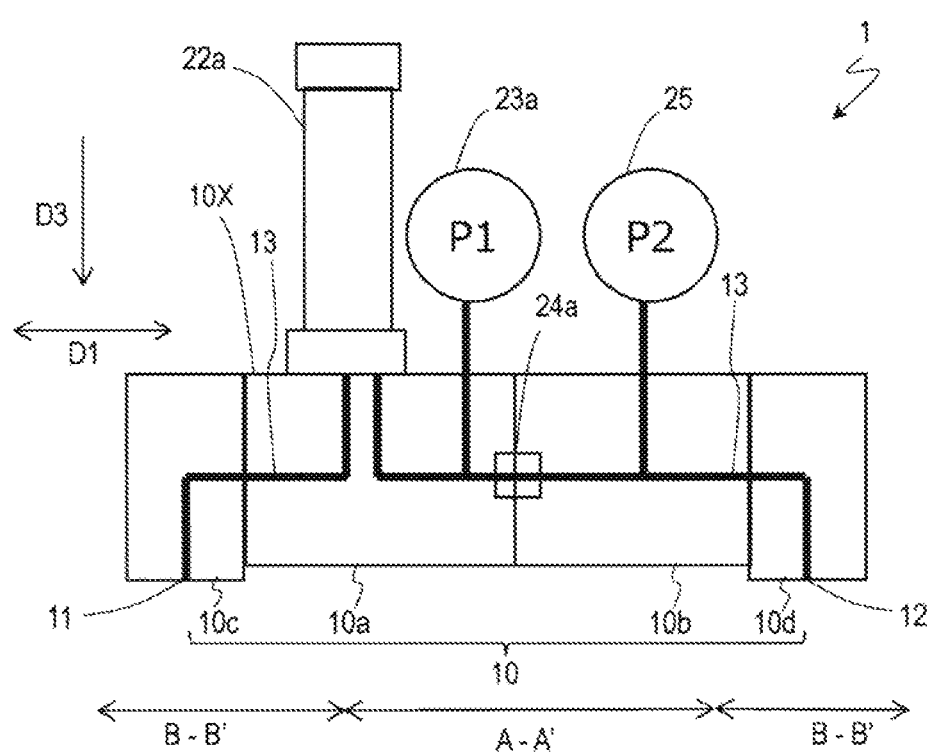

Hereinafter, a specific configuration example of the pressure-type flow controller 1 will be described with reference to FIGS. 4(a) and (b). FIGS. 4(a) and (b) show a mode in which the inflow pressure sensor 21 shown in FIG. 1 is not provided. However, needless to say, also in this configuration example, the inflow pressure sensor 21 may be provided in common for the first flow passage F1 and the second flow passage F2 on the upstream side of the control valves 22a and 22b. In addition, FIG. 4(b) corresponds to a cross-sectional view of FIG. 4(a). In order to clearly show the relation of flow passages, a cross-section corresponding to the line A-A' of FIG. 4(a) is shown at the center in the diagram, while a cross-section corresponding to the line B-B' of FIG. 4(a) is shown at each end in the diagram.

As shown in FIGS. 4(a) and (b), the pressure-type flow controller 1 includes a main body block 10 having formed therein a first flow passage F1 and a second flow passage F2. On an installation surface 10X of the main body block 10, control valves 22a and 22b and upstream pressure sensors 23a and 23b, which are constituent elements of first and second pressure-type flow rate control units 20a and 20b, respectively, and a downstream pressure sensor 25 are installed. As described below, the restriction parts 24a and 24b are installed to be interposed in the respective flow passages F1 and F2 inside the main body block 10. However, as used herein, even in the case where some constituent elements are disposed in other places like this, the first pressure-type flow rate control unit 20a (or the first fluid control unit) and the second pressure-type flow rate control unit 20b (or the second fluid control unit) may be described as being installed on the installation surface 10X of the main body block 10.

As shown in FIGS. 4(a) and (b), in this embodiment, the main body block 10 is formed by connecting and fixing the four block portions 10a to 10d. In addition, of the four block portions 10a to 10d, two intermediate block portions 10a and 10b each have formed therein part of the first flow passage F1 and part of the second flow passage F2, and these block portions 10a and 10b are connected to form the first flow passage F1 and the second flow passage F2.

The main body block 10 has an approximately rectangular shape as a whole in plan view and, as shown in the figure, has a length direction D1 and a width direction D2. The main body block 10 may be prepared using block portions 10a to 10d made of a metal such as stainless steel (SUS310L etc.), for example, and the connection and fixing of the block portions may be performed by welding, screwing, or the like.

In the end block portions 10c and 10d, a common inflow port 11 and a common outflow port 12 are provided, respectively. Meanwhile, control units are installed to the two intermediate block portions 10a and 10b. In addition, at the connection between the two intermediate block portions 10a and 10b, the restriction parts 24a and 24b interposed in the flow passages F1 and F2, respectively, are fixed.

As the restriction parts 24a and 24b, in addition to orifice members (orifice plates, etc.), critical nozzles or sonic nozzles may also be used. The bore diameter of the orifice or nozzle is set at 10 μm to 500 μm, for example.

According to such a configuration in which the restriction parts 24a and 24b are disposed at the connection between the block portions 10a and 10b, the installation or exchange of the restriction parts 24a and 24b can be performed relatively easily. Accordingly, even when the orifice is clogged with sediments, or the orifice diameter is enlarged due to corrosion, for example, the restriction parts 24a and 24b can be replaced to quickly deal with the problems. As a restriction part provided at the connection between the block portions 10a and 10b, it is suitable to use a gasket orifice capable of improving airtightness. Use of a gasket orifice is advantageous in that leakage at the connection of block portions can be prevented, and also replacement can be performed relatively easily.

Hereinafter, the first flow passage F1 and the second flow passage F2 provided in the main body block 10 will be described in detail.

As shown in FIG. 4(a), the first flow passage F1 and the second flow passage F2 in this embodiment include a first flow passage portion 13 extending along the length direction D1 (sometimes referred to as "first direction") of the main body block 10 and a second flow passage portion 14 extending along the width direction D2 (sometimes referred to as "second direction") of the main body block 10 as viewed from the normal direction D3 of the installation surface 10X. In addition, the first flow passage F1 and the second flow passage F2 do not include a flow passage portion extending along an oblique direction (a direction different from the length direction D1 and the width direction D2) as viewed from the normal direction D3.

The length direction D1 and the width direction D2 are directions orthogonal to each other. However, as used therein, "directions orthogonal to each other" means directions intersecting each other at an angle of about 80° to 90°. That is, even in the case where the first flow passage portion 13 and the second flow passage portion 14 intersect at an angle somewhat deviating from 90° due to working errors or the like, they are understood as being formed in directions orthogonal to each other.

The first flow passage portion 13 extending along the length direction D1 can be formed by previously making a small hole using a drill or the like along the length direction D1 from the connection surface, the bottom surface, or the like of each of the block portions 10a to 10d constituting the main body block 10, and then connecting and fixing the block portions 10a to 10d. Meanwhile, the second flow passage portion 14 can be formed by making a hole 14' using a drill or the like along the width direction D2 from the side surface 10Y of the main body block 10, and sealing the aperture 14a of the hole 14'.

As a sealing member 15 for sealing the aperture 14a of the hole 14' constituting the second flow passage portion 14, various kinds may be used. For example, as described below, the aperture 14' may be sealed with a blind plug or the like. Patent Document 3 describes a method in which a hole is made from a side surface of a metal block, and the aperture thereof is closed, thereby forming a flow passage. Also in the embodiment of the present invention, the second flow passage portion 14 may be formed using the similar method as the method described in Patent Document 3.

As described above, in this embodiment, the first flow passage F1 and the second flow passage F2 are formed by constituting a main body block from a plurality of block portions, and combining flow passage portions extending along the length direction D1 and the width direction D2 as viewed from the normal direction D3. Typically, in the entire flow passage, an angular U-shaped flow passage portion is included.

Then, according to the configuration of this embodiment, unlike in the formation of a flow passage in an oblique direction, flow passages can be accurately formed with no difficulty in alignment for drilling. In addition, the ensuring of space for flow passage formation in both the length direction and the width direction, which is required in the formation of an oblique flow passage, becomes unnecessary. Accordingly, flow passages along the width direction can be minimally provided, and, without a size increase in the length direction, pressure-type flow rate control units can be compactly mounted in various modes.

Hereinafter, with reference to FIG. 5 to FIG. 9, a more specific configuration example of the pressure-type flow controller 1 will be described. The configuration example described below employs a configuration in which a first flow passage F1 and a second flow passage F2 (see FIG. 8 and FIG. 9) are formed asymmetrically about the central axis along the length direction D1 as viewed from the normal direction D3, and flow passage portions along the width direction are minimally provided as described above. As a result, control units and pressure sensors are compactly disposed on the main body block 10, and the width of the main body block 10 can be made smaller than in the case where the first flow passage F1 and the second flow passage F2 are provided in parallel and spaced apart from each other in the width direction D2.

In the pressure-type flow controller 1 shown in FIG. 5 to FIG. 9, the constituent elements same as the constituent elements described above will be indicated with the same reference signs, and detailed descriptions thereof may be omitted.

Figure 5:
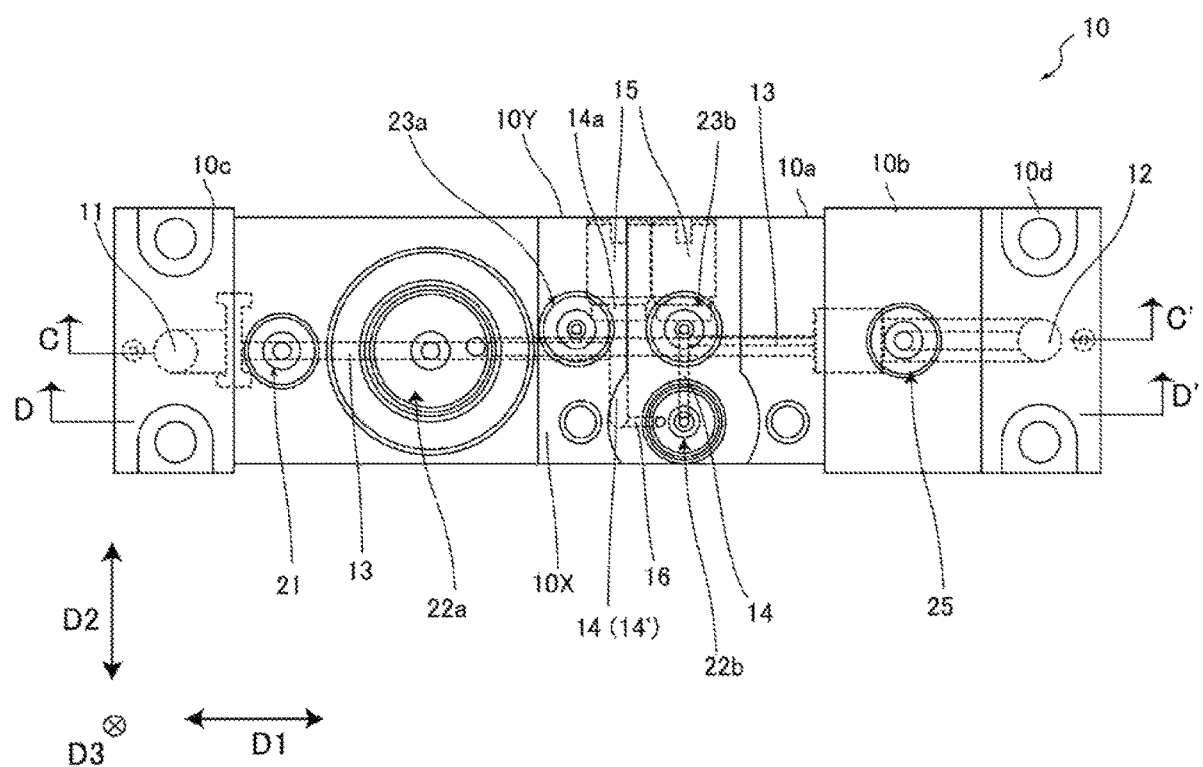
FIG. 5 A plan view showing the configuration of a fluid control device according to an embodiment of the present invention in further detail.
Figure 6:
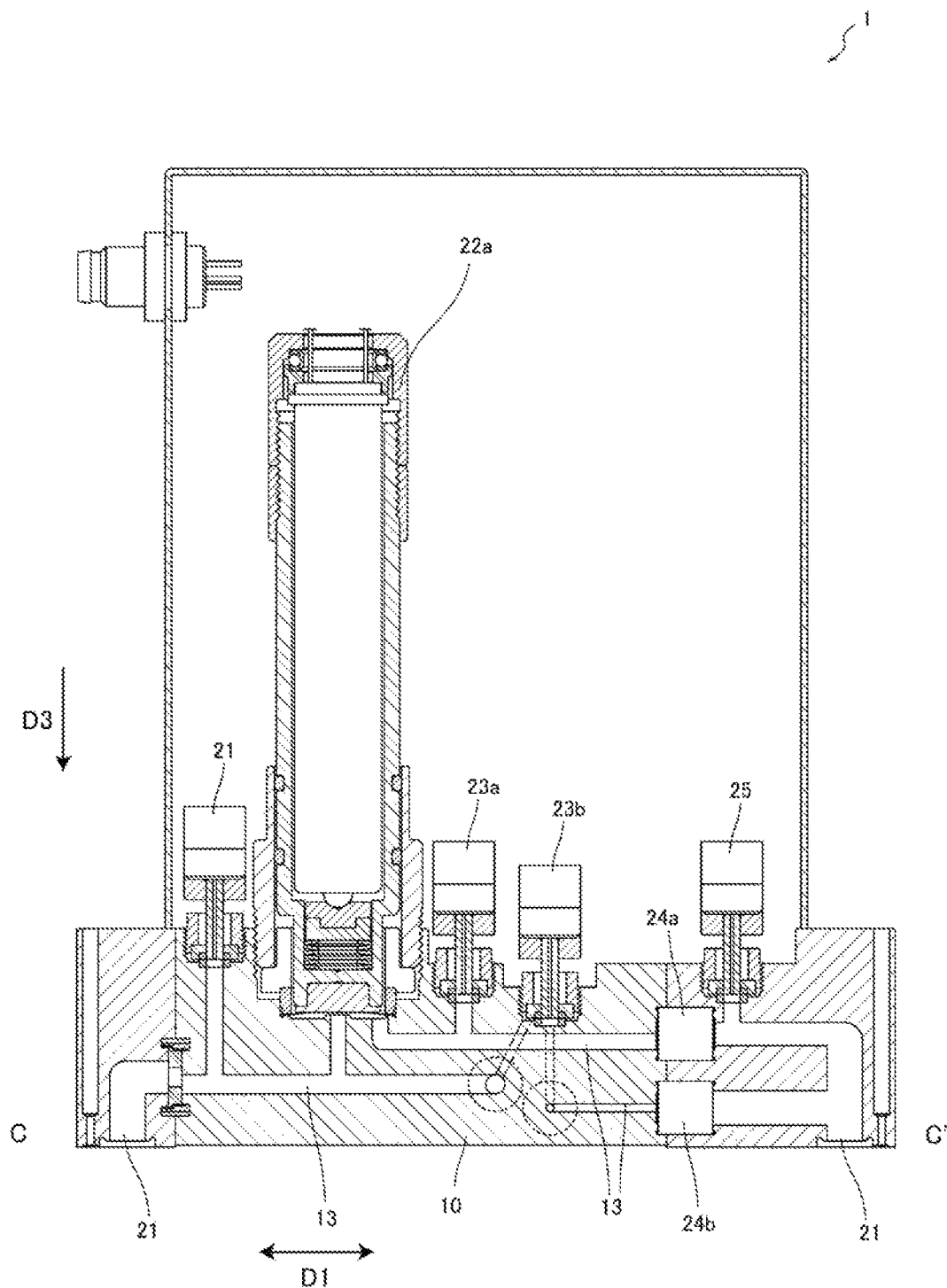
FIG. 6 A cross-sectional view along the line C-C' in FIG. 5.
Figure 7:
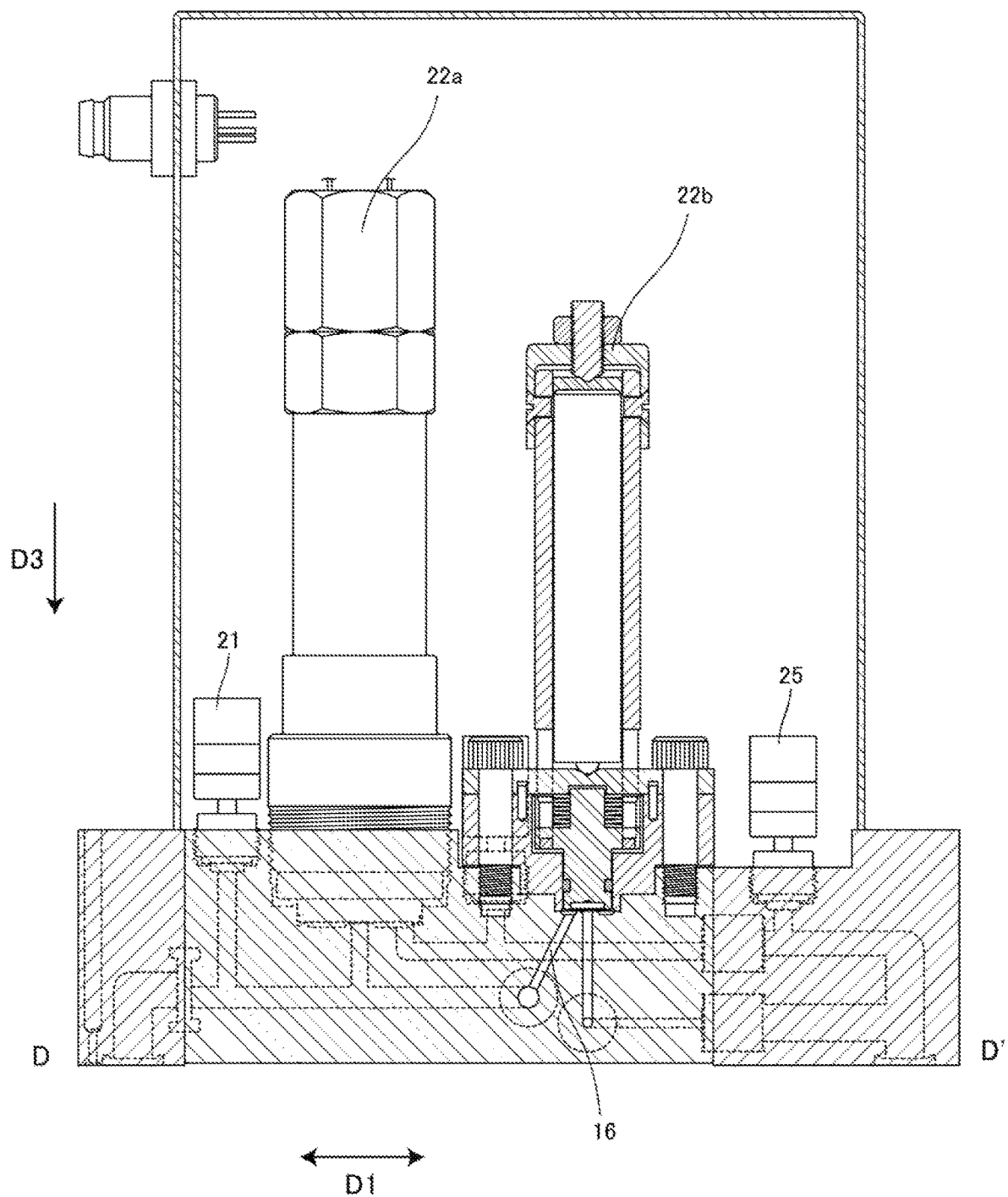
FIG. 7 A cross-sectional view along the line D-D' in FIG. 5.

FIG. 5 is a plan view of the main body block 10 as viewed from the normal direction of the installation surface 10X. In addition, FIG. 6 shows a cross-section along the line C-C' in FIG. 5, and FIG. 7 shows a cross-section along the line D-D' in FIG. 5. Note that the pressure-type flow controller 1 shown in FIG. 6 and FIG. 7 has pressure-type flow rate control units installed.

Figure 8:
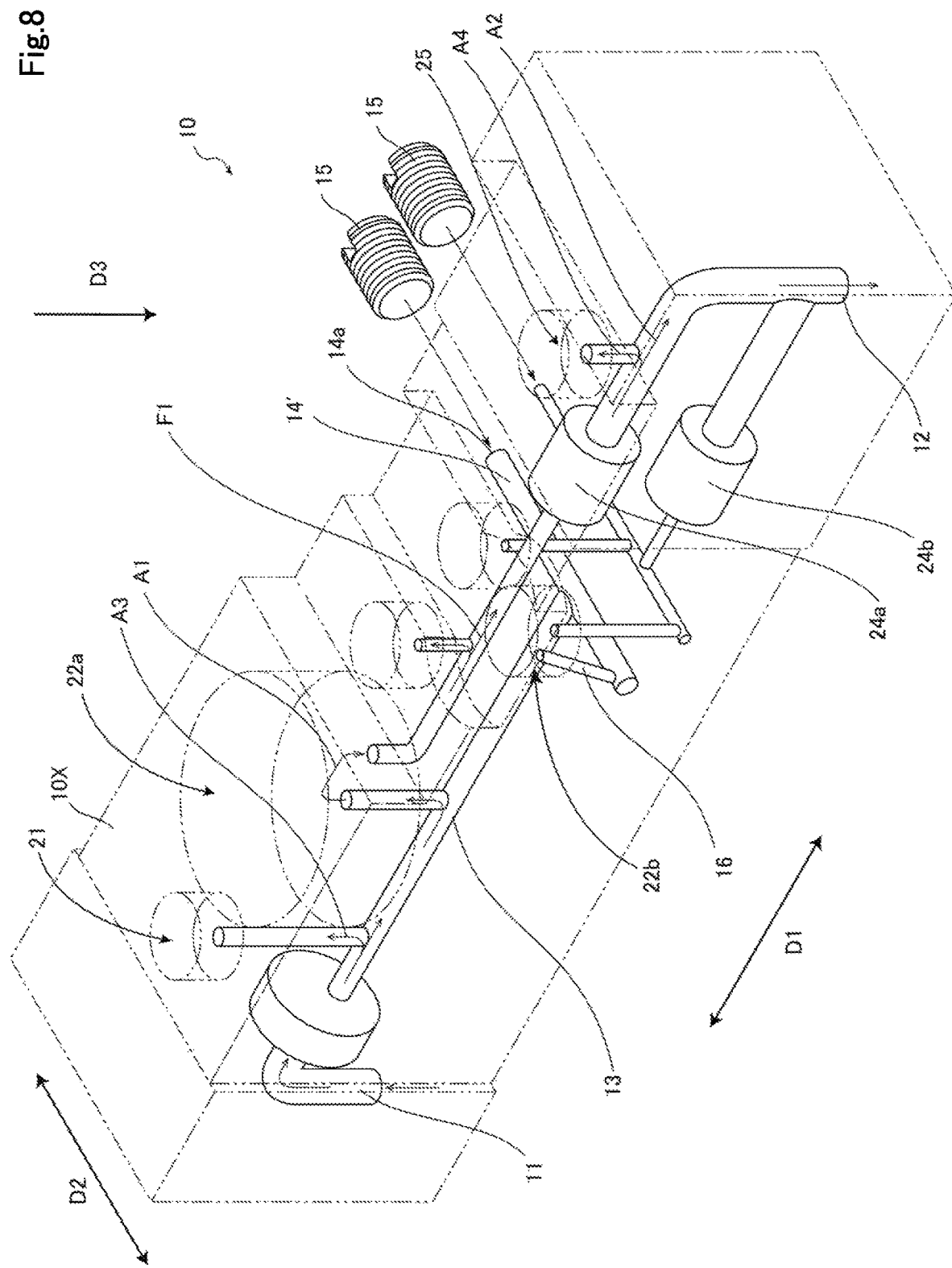
FIG. 8 A perspective view schematically showing the flow passages of the fluid control device shown in FIG. 5 to FIG. 7, where how a gas flows through the first flow passage is indicated with arrows.

In addition, FIG. 8 and FIG. 9 are perspective views schematically showing the flow passages of the fluid control device shown in FIG. 5 to FIG. 7. In FIG. 8 and FIG. 9, how a gas flows through the first flow passage F1 and how a gas flows through the second flow passage F2 are indicated with arrows, but the configuration of flow passages and the like is the same between FIGS. 8 and 9. As shown in FIG. 8, when a gas flows through the first flow passage F1, the gas from the common inflow port 11 runs through the control valve 22a as indicated with the arrow A1, and, through the restriction part 24a, flows to the common outflow port 12 as indicated with the arrow A2. At this time, the control valve 22b of the second flow passage F2 is closed, and no gas flows through the control valve 22b and the restriction part 24b. Meanwhile, as shown in FIG. 9, when a gas flows through the second flow passage F2, the gas from the common inflow port 11 runs through the control valve 22b as indicated with the arrow B1, and, through the restriction part 24b, flows to the common outflow port 12 as indicated with the arrow B2. At this time, the control valve 22a of the first flow passage F1 is closed, and no gas flows through the control valve 22a and the restriction part 24a. In addition, as shown in FIG. 8 and FIG. 9, in either case where a gas flows through the first flow passage F1 or the second flow passage F2, because the gas flows to the inflow pressure sensor 21 as indicated with the arrows A3 and B3, the inflow-side pressure can be detected, and also because the gas flows to the downstream pressure sensor 25 as indicted with the arrows A4 and B4, the downstream pressure can be detected.

As shown in FIG. 5 to FIG. 9, in the main body block 10, the first flow passage F1 and the second flow passage F2 are provided between the common inflow port 11 and the common outflow port 12. These flow passages F1 and F2 are formed of a combination of a first flow passage portion 13 extending along the length direction D1 and a second flow passage portion 14 extending along the width direction D2 as viewed from the normal direction D3 of the installation surface 10X, and do not include a flow passage portion provided in an oblique direction. In addition, the flow passage portion 14 extending along the width direction D2 is provided only in the second flow passage F2, and is formed by, as shown in FIG. 5, FIG. 8, and FIG. 9, a hole 14' opened to a side surface 10Y of the main body block being sealed by a sealing member 15 (here, a blind plug).

As shown in FIG. 7, in the vicinity of the control valve 22b provided in the second flow passage F2, a flow passage portion 16 provided in an oblique direction in the shown cross-section is formed. However, this flow passage portion is a flow passage portion extending along the length direction D1 as viewed from the normal direction D3.

Figure 3:
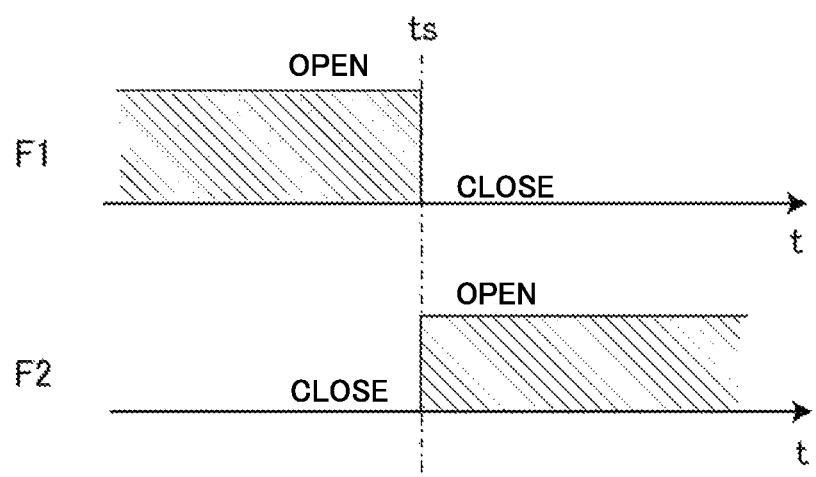
FIG. 3 Diagrams for explaining an operation example of a fluid control unit at the time of flow passage switching in an embodiment of the present invention; (a) shows the opening and closing timing of the control valves in a first flow passage (high flow) F1 and a second flow passage (low flow) F2, (b) shows changes in the gas flow rates through the flow passages F1 and F2, and (c) shows changes in the total flow rate.
Figure 3:
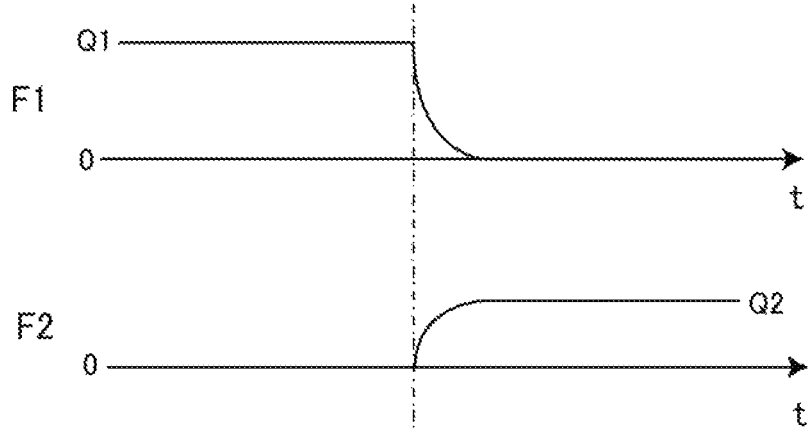
Figure 3:
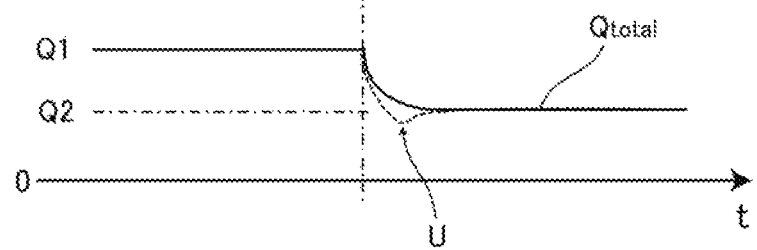

In this embodiment, the control valve 22a provided in the first flow passage F1 and the control valve 22b provided in the second flow passage F1 are spaced apart from each other in the length direction D1, and are not disposed side by side in the width direction D2 like the mode shown in FIG. 3. Similarly, the upstream pressure sensor 23a provided in the first flow passage F1 and the upstream pressure sensor 23b provided in the second flow passage F2 are not side by side in the width direction D2 either, but are disposed side by side along the length direction D1. Also in this example, the inflow pressure sensor 21 and the downstream pressure sensor 25 are provided in common for the first flow passage F1 and the second flow passage F2.

In addition, the control valve 22a and the control valve 22b used are in different modes. More specifically, as the control valve 22a, a large-sized control valve suitable for high-flow control is used, while as the control valve 22b, a small-sized control valve suitable for low-flow control is used. As a result of using such a small-sized control valve 22b, space saving can be realized.

Further, as shown in FIG. 5, FIG. 8, and FIG. 9, in this embodiment, the first flow passage F1 and the second flow passage F2 are formed to partially overlap each other as viewed from the normal direction D3, and, corresponding to this, the restriction parts 24a and 24b are also disposed side by side along the normal direction D3.

In the configuration described above, the flow passages and the control units can be concentrated at the widthwise center of the main body block 10. Therefore, the width of the main body block 10 can be reduced.

Embodiments of the present invention have been described above, but various alterations are possible. For example, although a fluid control device provided with two flow passages, the first flow passage F1 and the second flow passage F2, have been described above, it is also possible to provide three or more flow passages. Also in the case where three or more flow passages are provided, it is preferable that the flow passages are composed only of flow passage portions extending along the orthogonal two directions described above.

In addition, as a restriction part, it is also possible to use a valve with a built-in orifice, in which an orifice member and a shut-off valve are integrally formed close to each other. When such a valve with a built-in orifice is used, a gas can be supplied with excellent step-up and step-down characteristics, and also short-time (pulse-wise) gas supply to the process chamber can be suitably performed.

In addition, although a mode in which two flow passages are provided to switch between low-flow and high-flow has been described above, a plurality of flow passages may also be provided for other purposes. For example, flow passages may be selected according to the kind of gas or the temperature. In addition, the present invention is applicable not only to pressure-type flow controllers but also to various fluid control devices provided with a plurality of flow passages.

INDUSTRIAL APPLICABILITY

The fluid control device according to an embodiment of the present invention is suitable for being connected to a gas supply line of semiconductor manufacturing to perform flow control, for example.

REFERENCE SIGNS LIST

1: Pressure-type flow controller (fluid control device)
5: Control part
10: Main body block
10X: Installation surface
10Y: Side surface
11: Common inflow port
12: Common outflow port
13: First flow passage portion
14: Second flow passage portion
14': Hole
14a: Aperture
15: Sealing member
20a: First pressure-type flow rate control unit (first fluid control unit)
20b: Second pressure-type flow rate control unit (second fluid control unit)
21: Inflow pressure sensor
22a, 22b: Control valve
23a, 23b: Upstream pressure sensor
24a, 24b: Restriction part
25: Downstream pressure sensor
F1: First flow passage
F2: Second flow passage
D1: Length direction (first direction)
D2: Width direction (second direction)
D3: Normal direction

The invention claimed is:

1. A fluid control device comprising:
a main body block including a common inflow port, a common outflow port, a first flow passage, and a second flow passage, the first flow passage and the second flow passage both communicating with the common inflow port and the common outflow port;
a first fluid control unit provided in the first flow passage; and
a second fluid control unit provided in the second flow passage,
the fluid control device being configured such that
at least part of the first fluid control unit and at least part of the second fluid control unit are fixed to an installation surface of the main body block,
at least one of the first flow passage and the second flow passage includes a first flow passage portion extending only in a first direction as viewed from a normal direction of the installation surface and a second flow passage portion extending only in a second direction orthogonal to the first direction, as viewed from the normal direction, and
the second flow passage portion includes a hole extending along the second direction from a surface located lateral to the installation surface of the main body block and a sealing member closing an aperture of the hole,
wherein the first fluid control unit and the second fluid control unit each include a control valve, an upstream pressure sensor provided on a downstream side of the control valve, a restriction part provided on a downstream side of the upstream pressure sensor, and a control part connected to the upstream pressure sensor and the control valve to form a pressure-type flow rate control unit, and the main body block is formed by connecting and fixing a first block portion having formed therein part of the first flow passage and part of the second flow passage and a second block portion having formed therein part of the first flow passage and part of the second flow passage, and, at a connection between the first block portion and the second block portion, the restriction part of the first fluid control unit and the restriction part of the second fluid control unit are provided.

2. The fluid control device according to claim 1, wherein the control valve of the first fluid control unit and the control valve of the second fluid control unit are spaced apart from each other in the first direction.

3. The fluid control device according to claim 1, wherein the first flow passage and the second flow passage at least partially overlap each other as viewed from the normal direction.

4. The fluid control device according to claim 1, wherein the control part is configured such that when a fluid is flowed through one flow passage of the first flow passage and the second flow passage, based on the output of the upstream pressure sensor provided in said one flow passage, the opening degree of the control valve is controlled, while the control valve provided in the other flow passage is controlled to close.

5. The fluid control device according to claim 4, wherein the control part is configured such that when a fluid is flowed through said one flow passage, the flow rate in the other flow passage after closing the control valve provided in the other flow passage is detected, and, based on the detection results, the control valve provided in said one flow passage is controlled.

6. The fluid control device according to claim 1, further comprising, on a downstream side of the restriction parts of the first fluid control unit and the second fluid control unit, a downstream pressure sensor provided in common for the first flow passage and the second flow passage.

7. The fluid control device according to claim 1, wherein the restriction parts each include an orifice member.

8. The fluid control device according to claim 1, wherein the control valves each include a sheet made of a resin.

9. The fluid control device according to claim 1, wherein the main body block has a rectangular shape as viewed from the normal direction, and the first direction is a length direction of the main body block, while the second direction is a width direction of the main body block.

10. The fluid control device according to claim 1, wherein in an entire flow passage including the first flow passage and the second flow passage, an angular U-shaped flow passage portion is included as viewed from the normal direction.

11. The fluid control device according to claim 1, wherein
both of the first flow passage and the second flow passage are commonly connected to a first common flow passage communicating with the common inflow port and a second common flow passage communicating with the common outflow port.

* * * * *